(12) United States Patent
Kishimoto et al.

(10) Patent No.: US 7,327,206 B2
(45) Date of Patent: Feb. 5, 2008

(54) SURFACE ACOUSTIC WAVE DUPLEXER

(75) Inventors: Yasunori Kishimoto, Yasu (JP); Norio Taniguchi, Shiga-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 221 days.

(21) Appl. No.: 10/552,292

(22) PCT Filed: Jun. 4, 2004

(86) PCT No.: PCT/JP2004/007823

§ 371 (c)(1),
(2), (4) Date: Oct. 3, 2005

(87) PCT Pub. No.: WO2004/112246

PCT Pub. Date: Dec. 23, 2004

(65) Prior Publication Data
US 2006/0192633 A1    Aug. 31, 2006

(30) Foreign Application Priority Data
Jun. 16, 2003  (JP) ............................. 2003-171042

(51) Int. Cl.
*H03H 9/72* (2006.01)
(52) U.S. Cl. ...................... 333/133; 333/193
(58) Field of Classification Search ................ 333/133
See application file for complete search history.

(56) References Cited
U.S. PATENT DOCUMENTS

| | | | | |
|---|---|---|---|---|
| 5,914,646 A * | 6/1999 | Hashimoto | ................. | 333/195 |
| 5,999,069 A * | 12/1999 | Ushiroku | .................... | 333/193 |
| 6,369,672 B1* | 4/2002 | Ikada | .......................... | 333/193 |
| 6,819,203 B2* | 11/2004 | Taniguchi | .................. | 333/193 |
| 6,891,449 B2* | 5/2005 | Takayama et al. | ......... | 333/133 |
| 6,937,113 B2* | 8/2005 | Ohashi et al. | .............. | 333/133 |

FOREIGN PATENT DOCUMENTS

| | | |
|---|---|---|
| EP | 1 005 153 | 5/2000 |
| JP | 05-183380 | 7/1993 |
| JP | 9-135145 | * 5/1997 |
| JP | 10-093382 | 4/1998 |
| JP | 2000-315936 | 11/2000 |
| JP | 2001-298348 | 10/2001 |

OTHER PUBLICATIONS

Official Communication dated Aug. 31, 2004, corresponding Japanese Patent Application No. PCT/JP2004/007823, filing date Jun. 4, 2004.

* cited by examiner

Primary Examiner—Barbara Summons
(74) Attorney, Agent, or Firm—Keating & Bennett, LLP

(57) ABSTRACT

A surface acoustic wave branching filter reduces deterioration of the insertion loss and improves the isolation characteristics. The surface acoustic wave filter includes first ends of a first acoustic wave filter, having a relatively low passband, and a second acoustic wave filter, having a relatively high passband, connected to a first common terminal which is connected to an antenna. A resonator of the first surface acoustic wave filter, among a plurality of parallel-arm resonators and a plurality of series-arm resonators, which is closest to the first common terminal is a parallel-arm resonator. The capacitance of the parallel-arm resonator that is closest to the first common terminal is less than ½ of the capacitance of the other parallel-arm resonators.

15 Claims, 9 Drawing Sheets

IMPEDANCE SMITH CHART

SURFACE ACOUSTIC WAVE DUPLEXER

BACKGROUND OF THE INVENTION

1. Field of the Invention

The present invention relates to a surface acoustic wave branching filter including first and second surface acoustic filters having different passbands and more particularly, the present invention relates to a surface acoustic wave branching filter of a ladder-type circuit structure having a plurality of series-arm resonators and a plurality of parallel-arm resonators.

2. Description of the Related Art

Up to now, various surface acoustic wave branching filters using a surface acoustic wave filter of a ladder-type circuit structure having series-arm resonators and parallel-arm resonators have been proposed.

For example, Japanese Unexamined Patent Application Publication No. 2000-315936 discloses a surface acoustic wave branching filter, as shown in FIG. 12. Here, a first surface acoustic wave filter $F_1$ for relatively low frequencies and a second surface acoustic wave filter $F_2$ for relatively high frequencies are connected to an antenna-side common terminal $T_0$. The first surface acoustic wave filter $F_1$, includes a series-arm resonator $R_{S0}$ and a parallel-arm resonator $R_P$, and the second surface acoustic wave filter $F_2$ includes a parallel-arm resonator $R_{P0}$ and a series-arm resonator $R_S$.

In the first surface acoustic wave filter $F_1$, a resonator that is closest to the common antenna terminal $T_0$ is the series-arm resonator $R_{S0}$ and, in the second surface acoustic wave filter $F_2$, a resonator that is closest to the common antenna terminal $T_0$ is the parallel-arm resonator $R_{P0}$.

Furthermore, a phase rotation line S is sandwiched between the second surface acoustic wave filter $F_2$ and the common antenna terminal $T_0$.

Japanese Unexamined Patent Application Publication No. 10-93382 discloses a surface acoustic wave filter of a ladder-type circuit structure, as shown in FIG. 13. Here, series-arm resonators $R_{S1}$ and $R_{S2}$ are connected in series in a series arm between an input terminal and an output terminal. Furthermore, a parallel-arm resonator $R_{P1}$ is disposed in a parallel arm connected between the input terminal and the series-arm resonator $R_{S1}$. A parallel-arm resonator $R_{P2}$ is disposed in a parallel arm, one end of which is connected between the series-arm resonators $R_{S1}$ and $R_{S2}$. Moreover, a parallel-arm resonator $R_{P3}$ is disposed in a parallel arm between the series-arm resonator $R_{S2}$ and the output terminal.

In this surface acoustic wave filter, the three parallel-arm resonators $R_{P1}$ to $R_{P3}$ are commonly connected to a common terminal 51 on a surface acoustic wave chip. Then, the common terminal 51 and the ground terminal of a package are connected by a bonding wire having an inductance $L_E$.

Japanese Unexamined Patent Application Publication No. 5-183380 describes a surface acoustic wave filter of a ladder-type circuit structure wherein the best capacitance ratio is ½ between a parallel-arm resonator disposed at an end portion and a parallel-arm resonator connected in a parallel arm sandwiched between series-arm resonators.

Moreover, Japanese Unexamined Patent Application Publication No. 2001-298348 discloses a surface acoustic wave branching filter, as shown in FIG. 14. As shown in FIG. 14, a first surface acoustic wave filter 61 for relatively low frequencies and a second surface acoustic wave filter 62 for relatively high frequencies are connected to a common terminal 71 on the antenna side in a surface acoustic wave branching filter 70. The surface acoustic wave filters 61 and 62 are surface acoustic wave filters of a ladder-type circuit structure having series-arm resonators S1 to S3 and parallel-arm resonators P1 to P6, respectively.

In a surface acoustic wave branching filter described in Japanese Unexamined Patent Application Publication No. 2000-315936, the series-arm resonator $R_{S0}$ is connected to a first stage of the first surface acoustic wave filter $F_1$ for relatively low frequencies, and the above-described phase rotation line S is connected to the second surface acoustic wave filter $F_2$.

In recent years, the reduction in size has been strongly required in surface acoustic wave branching filters. Accordingly, when the phase rotation line S is provided in a package, it has been difficult to ensure a sufficient line length for fully rotating the phase. Furthermore, the longer the line length of the phase rotation line S, the larger the resistance of the line. Accordingly, there has been a problem in that the loss of the surface acoustic wave branching filters increases.

On the other hand, when the line length of the phase rotation line S is reduced, the amount of phase rotation becomes small, the impedance matching of the surface acoustic wave filter $F_2$ deviates from a reference impedance of 50 Ω, the loss in the band increases, and there was a concern that isolation characteristics might deteriorate.

In the surface acoustic wave filter described in the above-described Japanese Unexamined Patent Application Publication No. 10-93382, it is stated that the amount of attenuation can be improved by commonly connecting the ground-side terminals of the parallel-arm resonators $R_{P1}$ to $R_{P3}$. However, only a technique for improving the amount of attenuation of a surface acoustic wave filter is disclosed, and nothing about the specific structure of series-arm resonators and parallel-arm resonators in a surface acoustic wave branching filter is described.

Furthermore, in Japanese Unexamined Patent Application Publication No. 5-183380, in the surface acoustic wave filter of a ladder-type circuit structure, although the capacitance ratio between a parallel-arm resonator disposed at an end portion and a parallel-arm resonator in a parallel arm disposed between series-arm resonators is described, it is only described to make the capacitance ratio of the parallel-arm resonators a fixed value. That is, nothing is described concerning a desirable structure of the series-arm resonators and the parallel-arm resonators in surface acoustic wave branching filters using a plurality of surface acoustic wave filters.

In the surface acoustic wave branching filter described in the Japanese Unexamined Patent Application Publication No. 2001-298348, the surface acoustic wave branching filter 70 using the surface acoustic wave filters 61 and 62 has the parallel-arm resonator $S_1$ that is closest to the common terminal 71. However, in the surface acoustic wave branching filter 70, a desirable structure of each of the series-arm resonators S1 to S3 and parallel-arm resonators P1 to P6, phase delay circuits, etc., are not specifically mentioned.

SUMMARY OF THE INVENTION

In order to overcome the problems described above, preferred embodiments of the present invention provide a surface acoustic wave branching filter capable of being reduced in size without having isolation characteristics deteriorated and having the loss increased in which a first surface acoustic wave filter having a relatively low passband and a second surface acoustic wave filter having a relatively high passband are connected to a common terminal on the antenna side and each surface acoustic wave filter includes a ladder-type surface acoustic wave filter.

In a preferred embodiment, a surface acoustic wave branching filter includes a first surface acoustic wave filter having a relatively low passband, a second surface acoustic wave filter having a relatively high passband, and a first common terminal to which first ends of the first and second surface acoustic wave filters are connected, wherein the first common terminal is connected to an antenna. In the surface acoustic wave branching filter, the first surface acoustic wave filter is a surface acoustic wave filter of a ladder-type circuit structure having a plurality of parallel-arm resonators and a plurality of series-arm resonators.

A resonator, among the plurality of series-arm resonators and the plurality of parallel-arm resonators, that is closest to the first common terminal is a parallel-arm resonator and the capacitance of the parallel-arm resonator that is closest to the first common terminal is less than ½ of the capacitance of the other parallel-arm resonator sandwiched between the series-arm resonators.

In a particular preferred embodiment of a surface acoustic wave branching filter of the present invention, the capacitance of the parallel-arm resonator that is closest to the first common terminal is in the range of about 1/40 to about 1/5 of the capacitance of the other parallel-arm resonator sandwiched between different series-arm resonators.

In another particular preferred embodiment of a surface acoustic wave branching filter of the present invention, the surface acoustic wave branching filter further includes a second common terminal to which one end of a parallel-arm resonator that is closest to the first common terminal and one end of the other parallel-arm resonator are connected, and an inductance element is added between the second common terminal and the ground potential.

In another particular preferred embodiment of a surface acoustic wave branching filter of the present invention, the surface acoustic wave branching filter further includes a package material housing the first and second surface acoustic wave filters, and the second common terminal is included in the package material.

In another particular preferred embodiment of a surface acoustic wave branching filter of the present invention, the resonance frequency of the parallel-arm resonator that is closest to the first common terminal is substantially the same as the resonance frequency of the other parallel-arm resonator.

In another particular preferred embodiment of a surface acoustic wave branching filter of the present invention, the surface acoustic wave branching filter further includes a phase adjustment element located between the second surface acoustic wave filter and the first common terminal.

In another particular preferred embodiment of a surface acoustic wave branching filter of the present invention, the amount of phase delay of the phase adjustment element is less than 90 degrees from the central frequency of the first surface acoustic wave filter and, when seen from the side of the first common terminal, at least 50% of the passband of the second surface acoustic wave filter is inductive.

In another particular preferred embodiment of a surface acoustic wave branching filter of the present invention, the phase adjustment element is a stripline.

In another particular preferred embodiment of a surface acoustic wave branching filter of the present invention, the phase adjustment element includes a capacitance element and a second inductance element.

In another particular preferred embodiment of a surface acoustic wave branching filter of the present invention, when seen from the first common terminal, at least 50% of the passband of the second surface acoustic wave filter is inductive.

In a surface acoustic wave branching filter of preferred embodiments of the present invention, first ends of a first surface acoustic wave filter having a relatively low passband and a second surface acoustic wave filter having a relatively high passband are connected to a first common terminal connected to an antenna side. In the surface acoustic wave branching filter in which the first surface acoustic wave filter includes a surface acoustic wave filter of a ladder-type circuit structure, a resonator, from a plurality of series-arm resonators and a plurality of parallel-arm resonators, which is closest to the first common terminal is a parallel-arm resonator. The capacitance of the parallel-arm resonator that is closest to the first common terminal is less than about ½ of the capacitance of the other parallel-arm resonator sandwiched between the series-arm resonators. Therefore, while deterioration of the insertion loss is reduced, isolation characteristics can be improved. In particular, when the capacitance ratio is in the range of about 1/40 to about 1/5, deterioration of the insertion loss is further reduced and simultaneously isolation characteristics can be effectively improved.

One end of the parallel-arm resonator that is closest to the first common terminal and one end of the other parallel-arm resonator are connected to a second common terminal, and when an inductance element is connected between the second common terminal and the ground potential, even if the capacitance of the parallel-arm resonator is reduced, isolation characteristics can be more effectively improved.

Furthermore, when the second common terminal is included in a package, the inductance element can be provided in the package and the surface acoustic wave filter can be reduced in size.

When the resonance frequency of the parallel-arm resonator that is closest to the first common terminal is substantially the same as the resonance frequency of the other parallel-arm resonators, isolation characteristics can be effectively improved without causing insertion loss due to the difference of characteristics of the parallel-arm resonators.

When a phase adjustment element is located between the second surface acoustic wave filter and the first common terminal, the loss at the first common terminal on the antenna side can be effectively reduced by the phase adjustment element.

When the amount of phase delay of the phase adjustment element is less than about 90 degrees from the central frequency of the first surface acoustic wave filter and, when seen from the side of the first common terminal, at least 50% of the passband of the second surface acoustic wave filter is inductive, the DPX coupling loss at the common terminal on the antenna side can be effectively reduced.

When the phase adjustment element includes a stripline, the stripline can be easily formed in the package and the loss can be reduced without preventing the reduction in size of a surface acoustic wave branching filter.

When the phase adjustment element is a phase adjustment circuit having a capacitance element and a second inductance element, the DPX coupling loss at the common terminal on the antenna side can be further reduced.

When seen from the side of the first common terminal, if at least 50% of the passband of the second surface acoustic wave filter is inductive, the DPX coupling loss at the common terminal on the antenna side can be effectively reduced.

Other features, elements, steps, advantages and characteristics of the present invention will become more apparent from the following detailed description of preferred embodiments thereof with reference to the attached drawings.

DETAILED DESCRIPTION OF PREFERRED EMBODIMENTS

Hereinafter, the present invention is made clear by describing preferred embodiments of the present invention with reference to the drawings.

Figure 1:
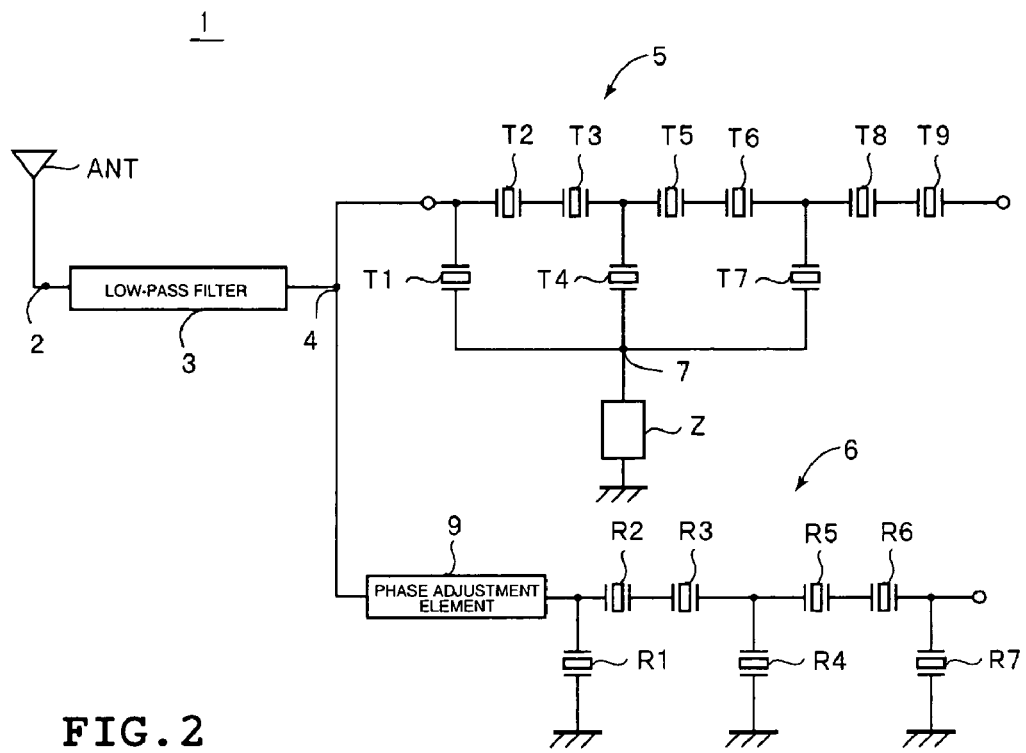
FIG. 1 shows the circuit structure of a surface acoustic wave branching filter according to a preferred embodiment of the present invention.

FIG. 1 shows the circuit structure of a surface acoustic wave branching filter according to a first preferred embodiment of the present invention.

In the surface acoustic wave branching filter of the present preferred embodiment, the passband on the transmission side is about 824 MHz to about 849 MHz and the passband on the reception side is about 869 MHz to about 894 MHz.

A surface acoustic wave branching filter 1 includes an ANT terminal 2 belonging to an antenna ANT. One end of a low-pass filter 3 is connected to the ANT terminal 2 and the other end of the low-pass filter 3 is connected to a first common terminal 4. That is, the first common terminal 4 is connected to the antenna ANT through the low-pass filter 3.

A transmission side surface acoustic wave filter 5 as a first surface acoustic wave filter having a relatively low passband and a reception side surface acoustic wave filter 6 as a second surface acoustic wave filter having a relatively high passband are connected to the first common terminal 4.

Each of the transmission side surface acoustic wave filter 5 and the reception side surface acoustic wave filter 6 is a surface acoustic wave filter of a ladder-type circuit structure having a plurality of series-arm resonators and a plurality of parallel-arm resonators.

Figure 2:
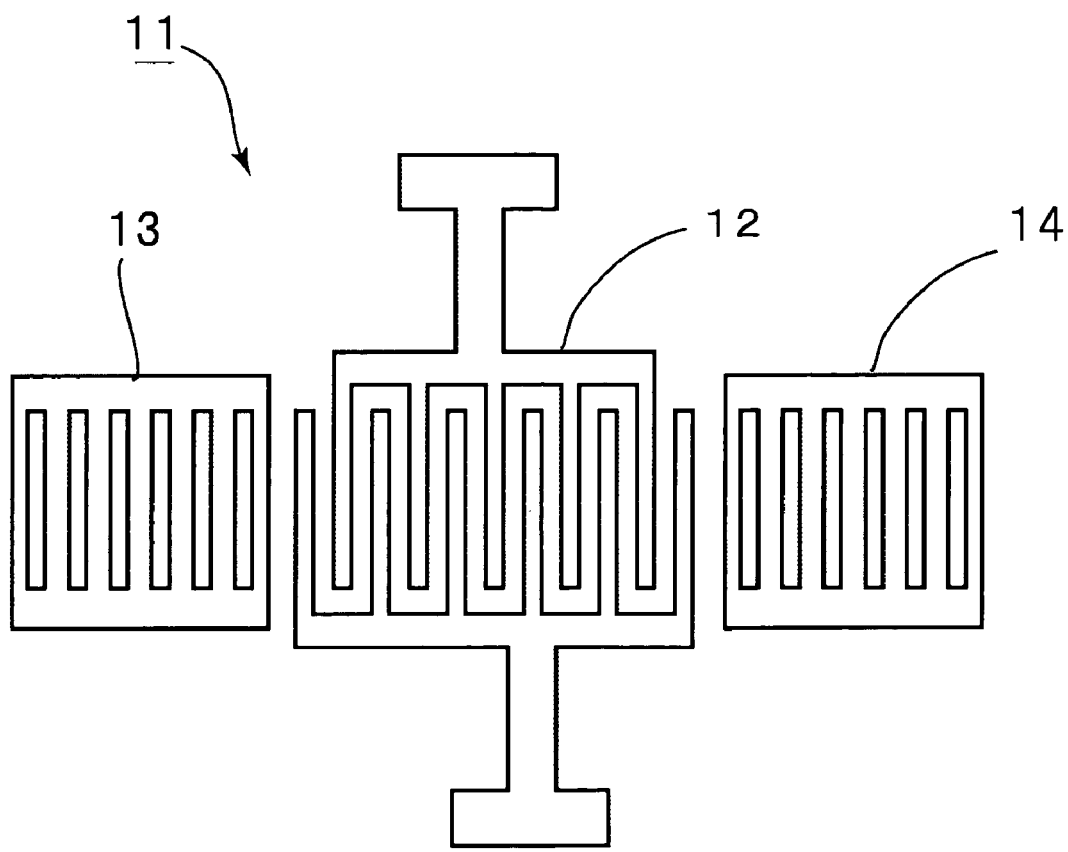
FIG. 2 is a schematic top view showing the electrode structure of a surface acoustic wave resonator used as a series-arm resonator or parallel-arm resonator in a preferred embodiment of the present invention.

FIG. 2 is a schematic top view showing the electrode structure of one surface acoustic wave resonator used as a parallel resonator or a series resonator in the surface acoustic wave filters 5 and 6. A surface acoustic wave resonator 11 includes a comb electrode 12 and reflectors 13 and 14 disposed on both sides in the surface acoustic wave propagation direction of the comb electrode 12. Moreover, in each of the series resonators and parallel resonators, the number, pitch, etc., of electrode fingers of the comb electrodes are properly selected in accordance with its capacitance and frequency.

The transmission side surface acoustic wave filter 5 includes series-arm resonators T2, T3, T5, T6, T8, and T9 and parallel-arm resonators T1, T4, and T7. In the transmission side surface acoustic wave filter 5, a resonator that is closest to the first common terminal 4 is the parallel-arm resonator T1. The parallel-arm resonator T4 is included in a parallel arm, one end of which is connected between the series-arm resonators T3 and T5. Furthermore, the parallel-arm resonator T7 is disposed in a parallel arm, one end of which is connected between the series-arm resonators T6 and T8.

The ground-side terminal of the parallel-arm resonators T1, T4, and T7 is commonly connected to a second common terminal 7 included in a package to be described later. Furthermore, an inductance element Z is connected between the second common terminal 7 and the ground potential.

The reception side surface acoustic wave filter 6 as the second surface acoustic wave filter includes parallel-arm resonators R1, R4, and R7 and series-arm resonators R2, R3, R5, and R6. Out of these resonators, the parallel-arm resonator R1 is the closest resonator to the first common terminal 4. The parallel-arm resonator R4 is included in a parallel arm, one end of which is connected between the series-arm resonators R3 and R5, and the parallel-arm resonator R7 is disposed in a parallel arm, one end of which is connected between the series-arm resonator R6 and a reception-side output terminal.

Moreover, a phase adjustment element 9 is disposed between the reception side surface acoustic wave filter 6 and the first common terminal 4.

Figure 3:
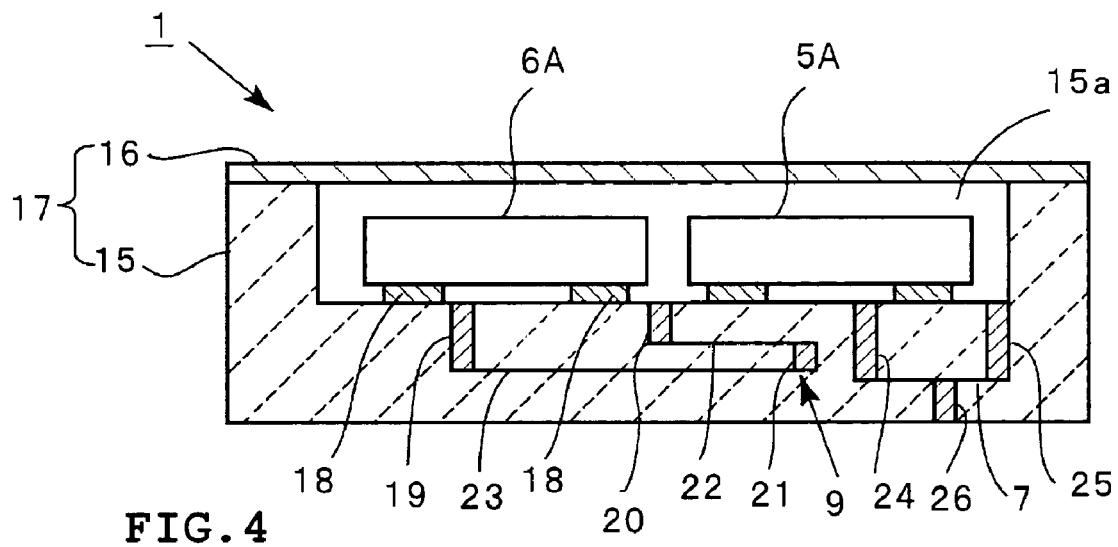
FIG. 3 is a schematic sectional front view showing the physical structure of the surface acoustic wave branching filter of a preferred embodiment of the present invention.

FIG. 3 is a schematic sectional front view showing the physical structure of the surface acoustic wave branching filter of the present preferred embodiment. The surface acoustic wave branching filter 1 includes a package 17 preferably having a case material 15 and a lid 16. The case material 15 is preferably made of an insulating ceramic such as alumina, for example, or an insulating material such as synthetic resin, for example. The lid 16 is preferably made of an appropriate material such as a conductive metal, for example, or an insulating material such as alumina, for example.

The case material 15 includes a concave portion 15a which is open upward and houses a transmission side surface acoustic wave filter chip 5A constituting the transmission side surface acoustic wave filter 5 and a reception side surface acoustic wave filter chip 6A constituting the reception side surface acoustic wave filter 6. The surface acoustic wave filter chips 5A and 6A are mounted on the case material 15 by a flip-chip bonding method. FIG. 3 shows the surface acoustic wave filter chips 5A and 6A joined to the bottom surface of the concave portion 15a by metal bumps 18, shown schematically. In practice, the electrodes of the surface acoustic wave filter chips 5A and 6A are electrically connected to the electrode lands disposed on the bottom surface of the concave portion 15a of the case material 15 by the metal bumps 18.

Furthermore, via-hole electrodes 19 and 20 are formed in the case material 15. A phase adjustment element 9 preferably including striplines 22 and 23 connected by a via-hole electrode 21 is arranged between the via-hole electrodes 19 and 20.

Via-holes electrodes 24 and 25 are disposed under the transmission side surface acoustic wave filter chip 5A in the case material 15. The upper end of the via-hole electrodes 24 and 25 reach the bottom surface of the concave portion 15a of the case material 15, and the upper ends are connected to the parallel-arm resonators T4 and T1 shown in FIG. 1. The lower ends of the via-hole electrodes 24 and 25 are connected to the second common terminal 7. The via-hole electrode (not shown in FIG. 3) connected to the ground-side terminal of the parallel-arm resonator T7 shown in FIG. 1 is also connected to the second common terminal 7.

The second common terminal 7 is embedded in the case material 15, and the upper end of a via-hole electrode 26 is connected to the lower surface of the second common terminal 7. The lower end of the via-hole electrode 26 reaches the lower surface of the case material 15 and is connected to a ground electrode (not illustrated) disposed on the lower surface of the case material 15.

In the present preferred embodiment, the surface acoustic wave filter chips 5A and 6A are constructed in such a way that a surface acoustic wave resonator and electrodes constituting connection electrodes are provided on a $LiTaO_3$ substrate preferably by using an electrode material having aluminum as a main component.

Furthermore, the phase adjustment striplines 22 and 23 preferably have a characteristic impedance of about 50 Ω, and the amount of phase shift is set in such a way that the phase is rotated by about 75 degrees at 836.5 MHz as the center frequency of the passband of the transmission side surface acoustic wave filter 5, for example.

One of the unique characteristics of the surface acoustic wave branching filter of the present preferred embodiment, in the transmission side surface acoustic wave filter 5 having a relatively low passband as described above, the parallel-arm resonator that is closest to the first common terminal 4, that is, the parallel-arm resonator that is closest to the antenna side is the parallel-arm resonator T1. The capacitance of the parallel-arm resonator T1 is preferably less than about 1/10 of the capacitance of the other parallel-arm resonators T4 and T7 sandwiched between the series-arm resonators. In such a way, leakage of a signal to the reception side surface acoustic wave filter 6 from the transmission side surface acoustic wave filter 5 is reduced and minimized. That is, isolation characteristics can be improved. This is described with reference to FIGS. 4 to 9.

In the present preferred embodiment, the number of pairs of electrode fingers, the cross width of electrode fingers, the wavelength, and the number of electrode fingers of reflectors of each resonator used in the transmission side surface acoustic wave filter 5 and the reception side surface acoustic wave filter 6 are as shown in Table 1 and Table 2.

TABLE 1

| No. of resonator | Number of pairs | Cross width | Wavelength | Number of electrode fingers of reflector |
|---|---|---|---|---|
| T1 | 50 | 20 | 4.892 | 15 |
| T2 | 164 | 110 | 4.656 | 15 |
| T3 | 164 | 110 | 4.667 | 15 |
| T4 | 80 | 125 | 4.892 | 15 |
| T5 | 112 | 102 | 4.662 | 15 |
| T6 | 112 | 102 | 4.662 | 15 |
| T7 | 80 | 125 | 4.892 | 15 |
| T8 | 112 | 200 | 4.673 | 15 |
| T9 | 163 | 135 | 4.694 | 15 |

TABLE 2

| No. of resonator | Number of pairs | Cross width | Wavelength | Number of electrode fingers of reflector |
|---|---|---|---|---|
| R1 | 125 | 64 | 4.575 | 15 |
| R2 | 115 | 126 | 4.368 | 15 |
| R3 | 115 | 39.4 | 4.368 | 15 |
| R4 | 125 | 203.5 | 4.569 | 15 |
| R5 | 115 | 39.4 | 4.368 | 15 |
| R6 | 115 | 126 | 4.368 | 15 |
| R7 | 112 | 72 | 4.575 | 15 |

Furthermore, since the result shown in FIGS. 4 to 9 was obtained by properly modifying the structure (construction) of the resonators used in the surface acoustic wave branching filter of the above-described preferred embodiment, and the case in which the capacitance ratio is about 1/10 corresponds to the present embodiment.

Figure 4:
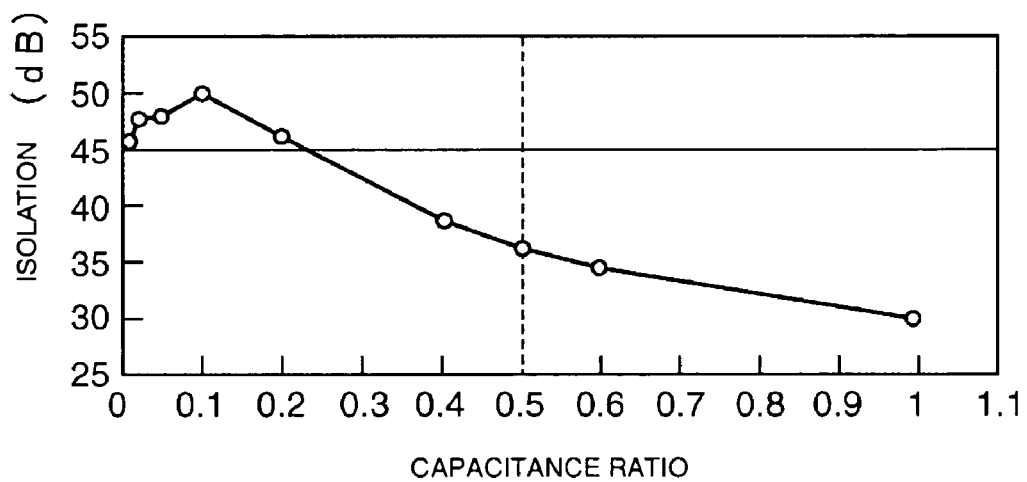
FIG. 4 shows the change of isolation when the capacitance ratio of the parallel-arm resonator in the surface acoustic wave branching filter of the first preferred embodiment is changed.
Figure 5:
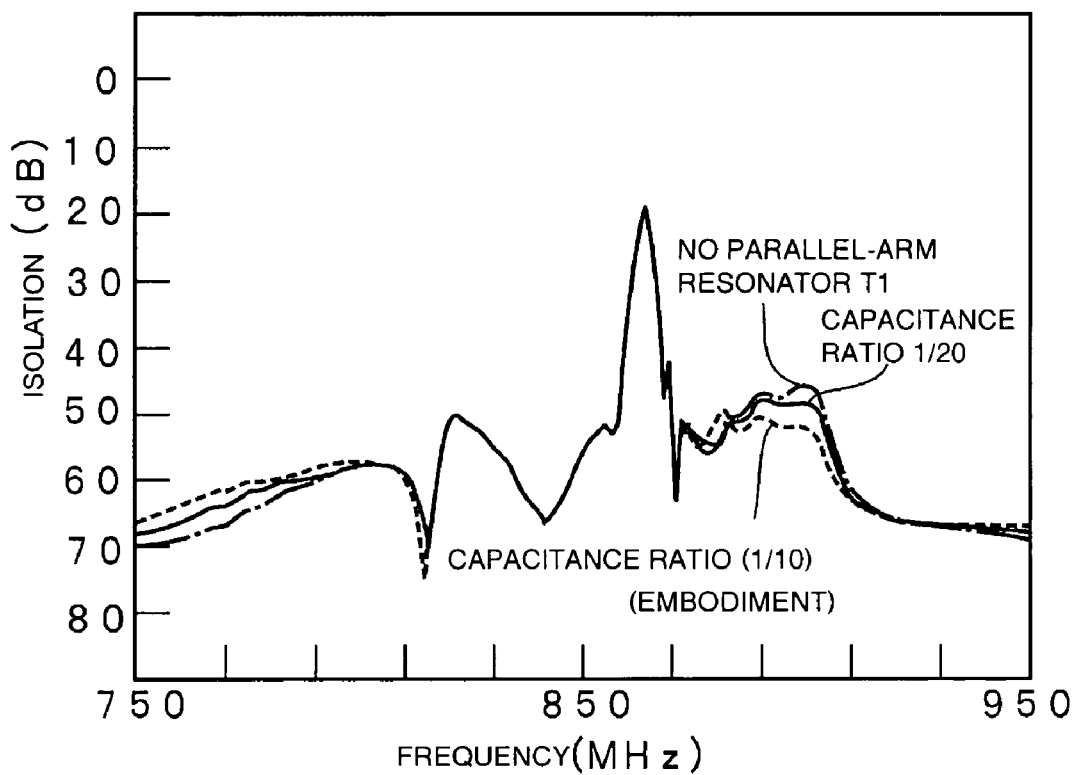
FIG. 5 shows isolation characteristics when the parallel-arm resonator that is closest to a first common terminal on the antenna side is not included and when the capacitance ratio of the parallel-arm resonator is approximately $1:20$ and approximately $1:10$.
Figure 6:
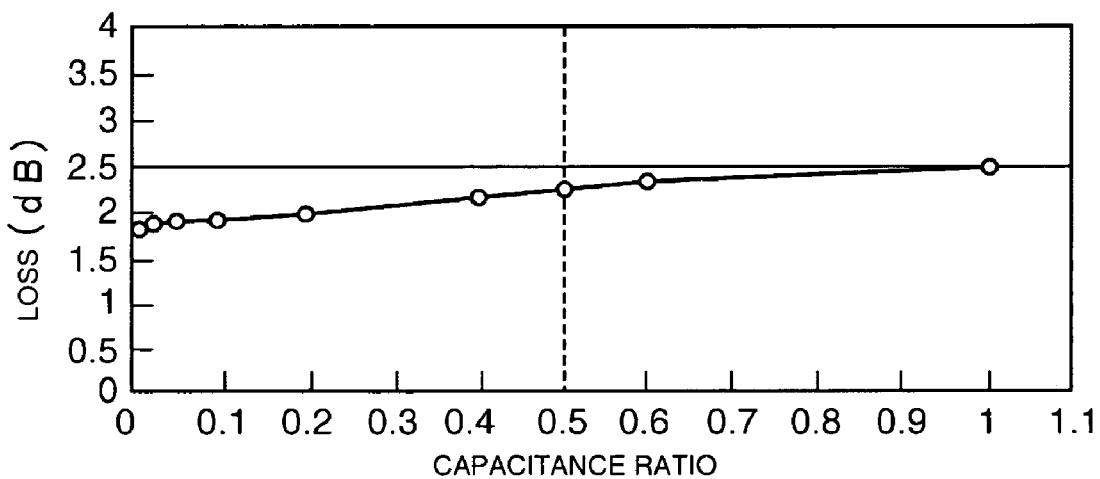
FIG. 6 shows the relationship between the capacitance ratio and the insertion loss of a parallel-arm resonator.
Figure 7:
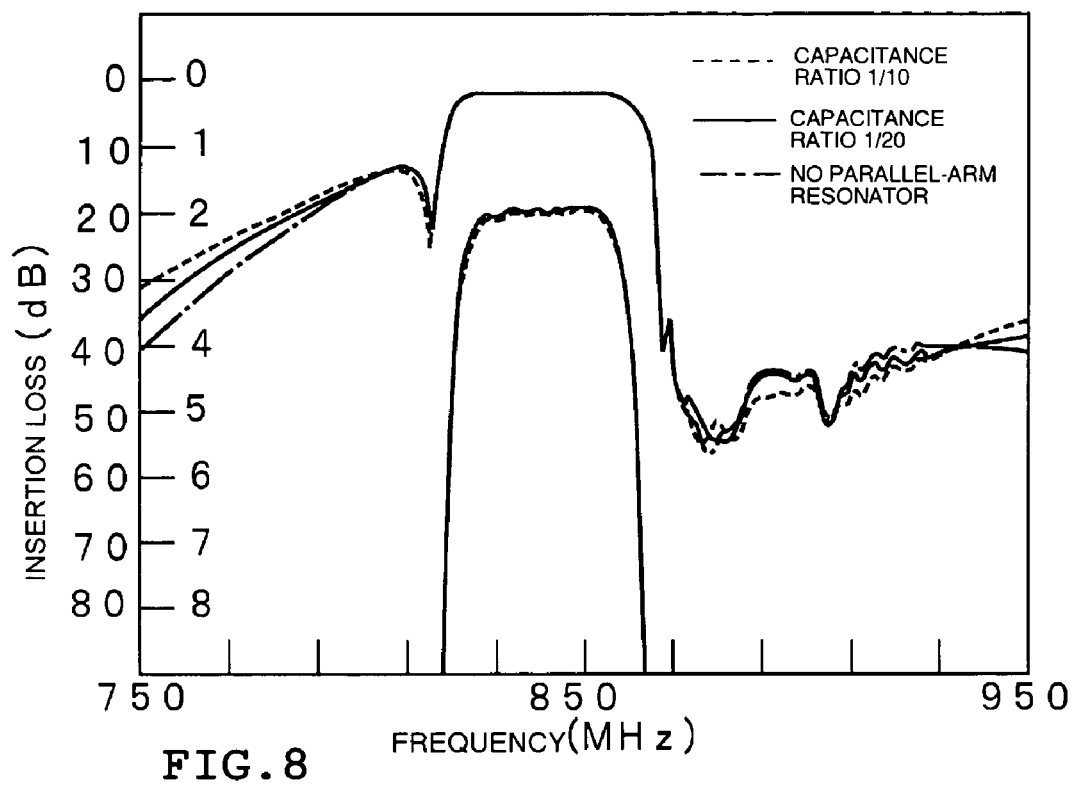
FIG. 7 shows frequency characteristics of the amount of attenuation when a parallel-arm resonator that is closest to a first common terminal in a surface acoustic wave filter is not included and when the capacitive ratio of a parallel-arm resonator is approximately ½0 and approximately ½0.

FIG. 4 shows the change of isolation when the capacitance ratio between the parallel-arm resonator T1 and the parallel-arm resonators T4 and T7 is changed. FIG. 5 shows isolation characteristics when the parallel-arm resonator T1 is not connected and when the capacitance ratio of the parallel-arm resonator T1 is about 1/20 and about 1/10 (representing the present preferred embodiment). Furthermore, FIG. 6 shows the relationship between the capacitance ratio and the insertion loss of the transmission side surface acoustic wave filter. FIG. 7 shows insertion loss characteristics of each transmission side surface acoustic wave filter when the parallel-arm resonator T1 is not connected and when the capacitance ratio of the parallel-arm resonator T1 is about 1/20 and about 1/10 in the same way as in FIG. 5.

Figure 8:
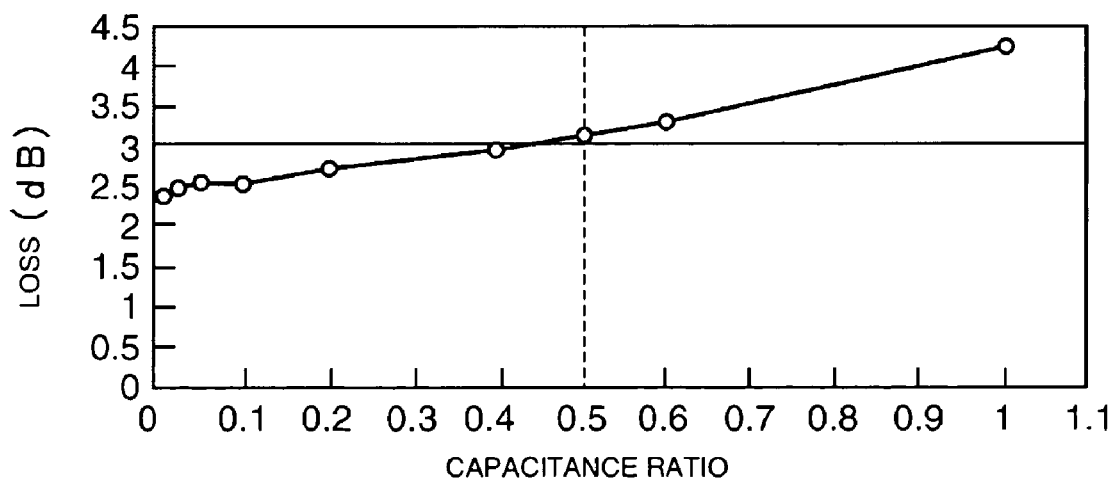
FIG. 8 shows the relationship between the capacitance ratio of a parallel-arm resonator and the insertion loss of a transmission side surface acoustic wave filter.
Figure 9:
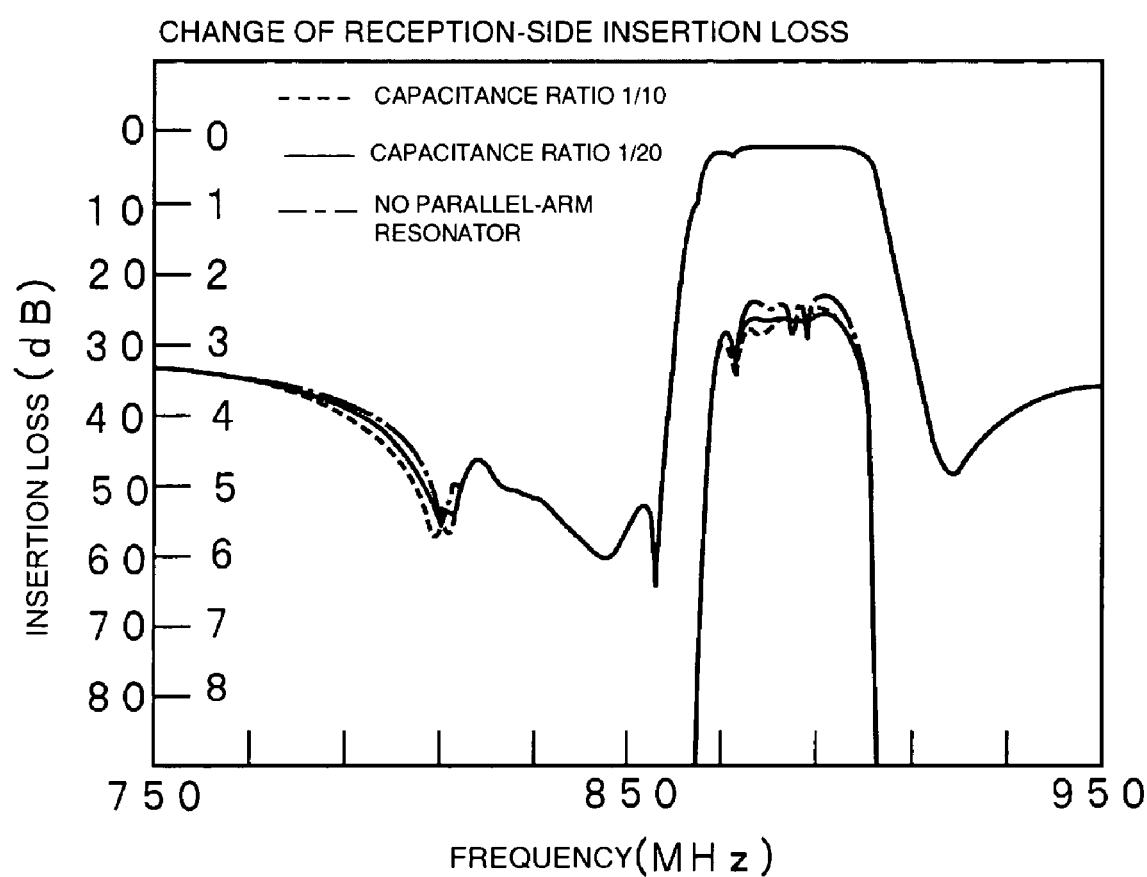
FIG. 9 shows frequency characteristics of the amount of attenuation of a reception side surface acoustic wave filter when the parallel-arm resonator as a resonator that is closest to the first common terminal in a first surface acoustic wave filter is not included and when the capacitance ratio of the parallel-arm resonator is approximately ½0 and approximately $1:10$.

Furthermore, FIG. 8 shows the insertion loss of a reception side surface acoustic wave filter relative to the capacitance ratio. FIG. 9 shows the insertion loss of each reception side surface acoustic wave filter in the case when the parallel-arm resonator T1 is not connected and when the capacitance ratio of the parallel-arm resonator T1 is about 1/20 and about 1/10. Moreover, the inner attenuation value to frequency characteristics shown in FIG. 9 are magnified in accordance with the right-hand scale of the perpendicular axis.

Moreover, in FIG. 7, the inner attenuation value to frequency characteristics are magnified in accordance with the right-hand scale of the vertical axis.

As is clearly understood from FIG. 5, leakage from the transmission side surface acoustic wave filter 5 to the reception side surface acoustic wave filter 6 is reduced and isolation characteristics can be improved by providing the parallel-arm resonator T1 compared with the case where the parallel-arm resonator T1 is not provided. That is, the case where the resonator that is closest to the first common terminal 1 is the series-arm resonator T2 in the transmission side surface acoustic wave filter 5. Furthermore, as clearly understood from FIG. 4, isolation characteristics can be improved particularly in the vicinity where the capacitance ratio is about 1/10. That is, when a resonator of the transmission side surface acoustic wave filter 5 which is closest to the first common terminal 4 on the antenna side is the parallel-arm resonator T1, it is understood that isolation characteristics can be improved in comparison with the case where the resonator which is closest to the common terminal 4 is a series-arm resonator.

Accordingly, in the surface acoustic wave filter circuit of a ladder-type circuit structure up to now, as described in Japanese Unexamined Patent Application Publication No. 5-183380, the most appropriate capacitance ratio is 1/2. When the change of isolation characteristics in FIG. 4 is considered, it is understood that the capacitance ratio of less than 1/2 is desirable in the surface acoustic wave branching filter having the first and second surface acoustic wave filters connected therein. It is understood that by making the capacitance ratio less than 1/2, a surface acoustic wave branching filter in which improved isolation characteristics can be provided in comparison with the case where a surface acoustic wave filter having a capacitance ratio of 1/2 is used.

On the other hand, as is understood from FIG. 4, when the capacitance ratio is less than about 1/40 or exceeds about 1/5, isolation characteristics become equivalent to the case where the parallel-arm resonator is not connected (capacitance ratio=0). Accordingly, it is desirable to make the capacitance ratio in the range of about 1/40 or higher and about 1/5 or lower.

As is clearly understood from FIGS. 5, 6, 8, and 9, there is a tendency that the higher the capacitance ratio becomes, the larger the loss of the transmission side surface acoustic wave filter 5 and the loss of the reception side surface acoustic wave filter 6 become. However, as is clearly understood from FIGS. 6 to 9, when the capacitance ratio is about 1/5 or less, the loss in the transmission side surface acoustic wave filter 5 and the reception side surface acoustic wave filter 6 is relatively small.

Accordingly, when the capacitance ratio is in the range of about 1/40 to about 1/5, deterioration of the insertion loss is reduced and simultaneously isolation characteristics can be improved.

Furthermore, in the present preferred embodiment, the grounding side terminal of the parallel-arm resonator T1 which is closest to the first common terminal 4 and the grounding side terminal of the other parallel-arm resonators T4 and T7 included in the surface acoustic wave filter chip 5A are commonly connected to the second common terminal 7. The second common terminal 7 is connected to the ground potential through the inductance element Z. Accordingly, since the inductance element Z is added at the portion where the parallel-arm resonator T1 is connected to the other parallel-arm resonators T4 and T7 through the common terminal 7, even if the capacitance of the parallel-arm resonator T1 is small, isolation characteristics can be effectively improved.

The resonance frequency of the parallel-arm resonator T1 is preferably made the same as the resonance frequency of the other parallel-arm resonators T4 and T7. In that case, no additional insertion loss due to the difference of resonance characteristics is caused and, as a result, isolation characteristics can be improved as described above.

Moreover, since the phase adjustment element 9 is connected to the reception side surface acoustic wave filter 6, the DPX coupling loss on the side of the common terminal 4 on the antenna side can be reduced.

In the present preferred embodiment, the amount of phase rotation by the phase adjustment element 9 of the reception side surface acoustic wave filter 6 is preferably made less than about 90 degrees from the center frequency of the passband of the reception side surface acoustic wave filter. In this case, since the amount of phase rotation can be made smaller, the phase adjustment element can be reduced in size and, as a result, the surface acoustic wave branching filter 1 can be reduced in size.

Figure 11:
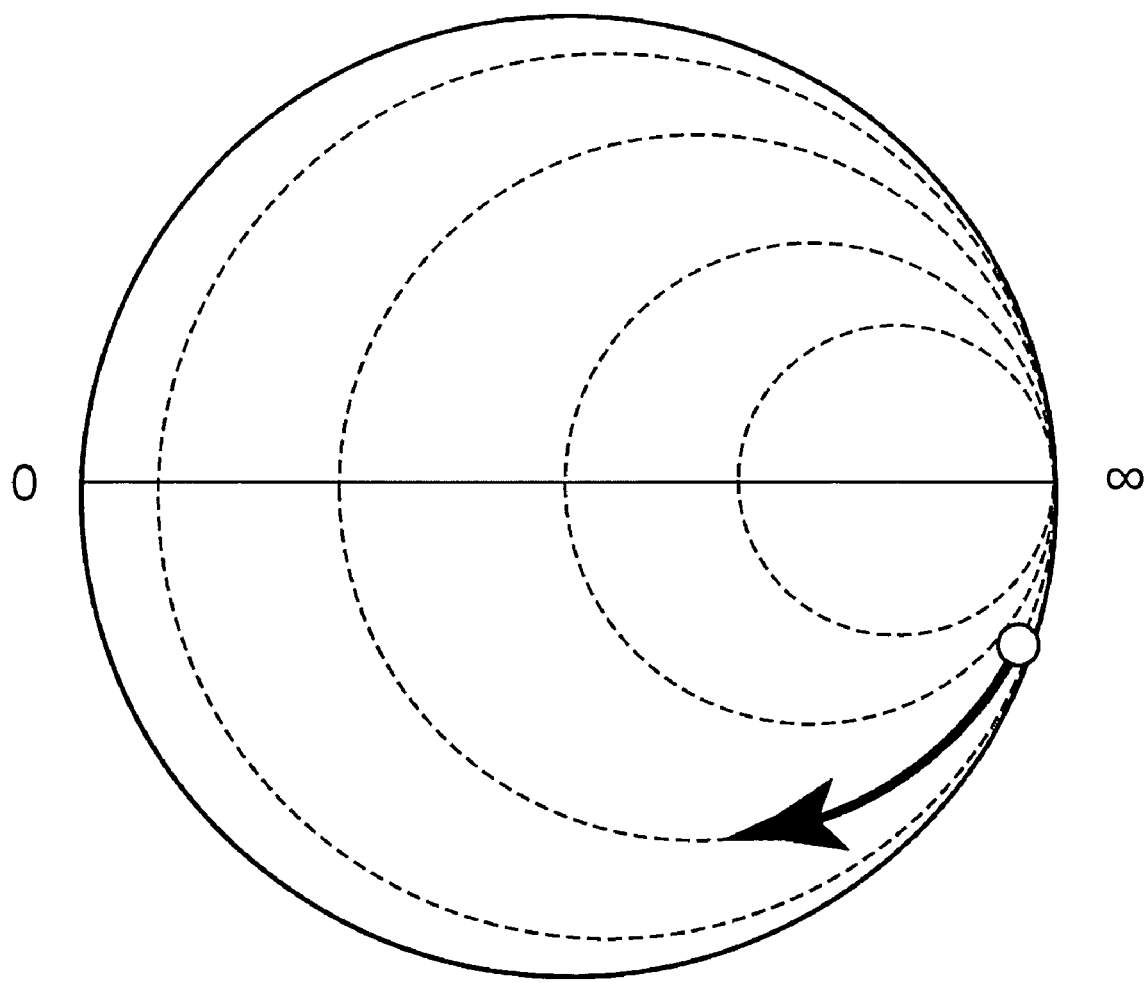
FIG. 11 shows the change of impedance on an impedance Smith chart when the series-arm resonator is capacitive in the case where the resonator that is closest to the first common terminal on the antenna side is a series-arm resonator.
Figure 12:
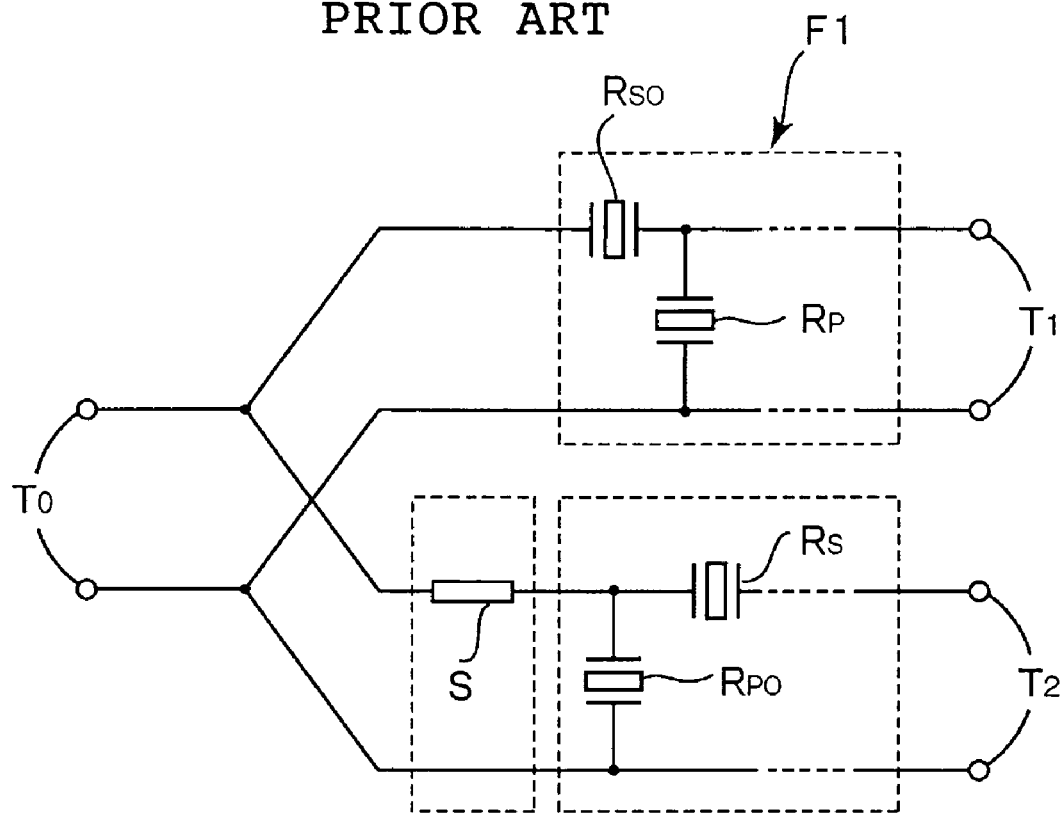
FIG. 12 is a circuit diagram showing one example of related surface acoustic wave branching filters.
Figure 13:
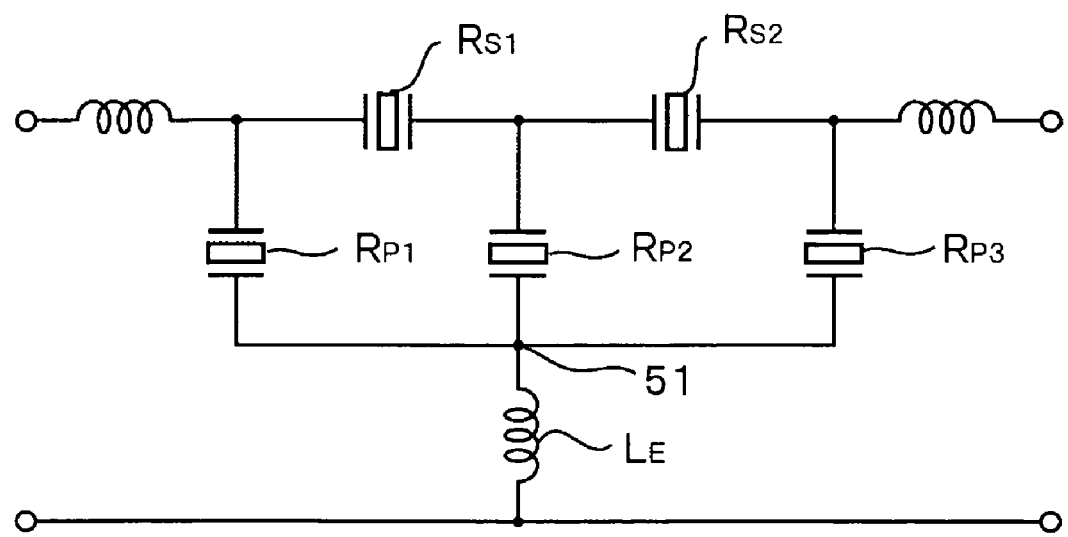
FIG. 13 is a circuit diagram showing one example of related surface acoustic wave branching filters.
Figure 14:
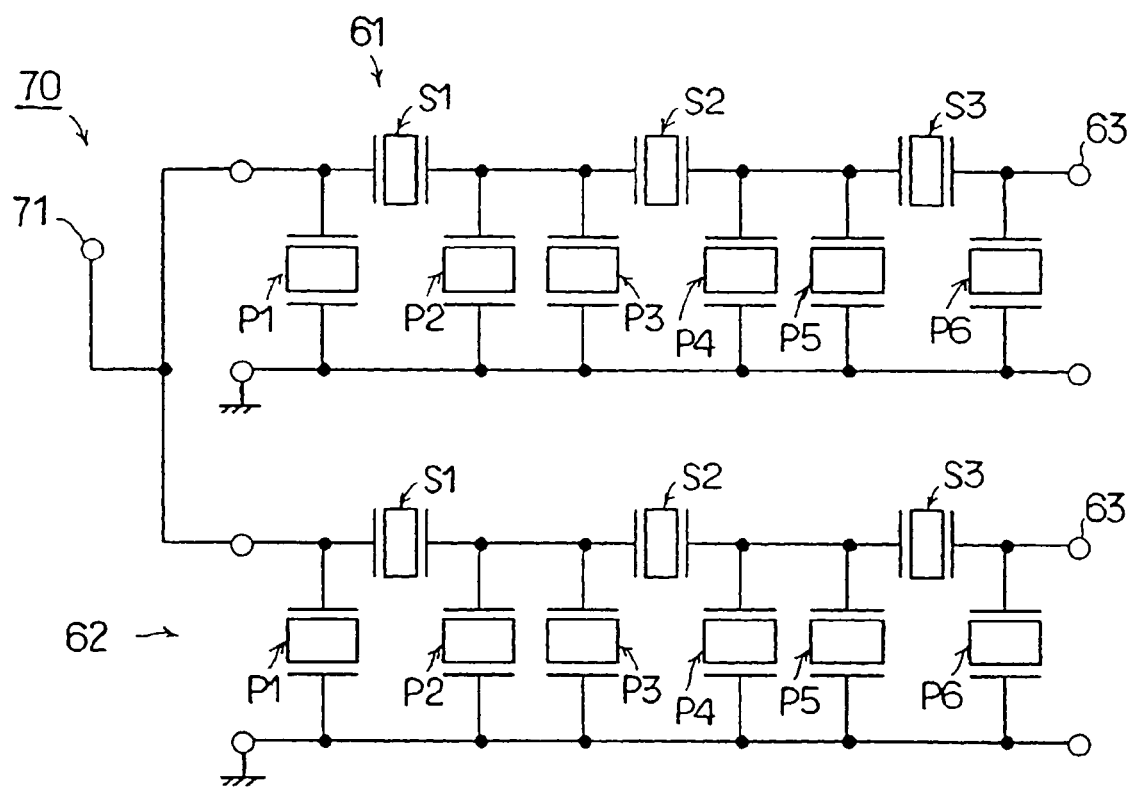
FIG. 14 is a circuit diagram showing another example of related surface acoustic wave branching filters.

In particular, when the amount of phase rotation is made less than about 90 degrees, in a stage before the transmission side surface acoustic wave filter 5 and the reception side surface acoustic wave filter 6 are coupled on the antenna side, the phase is made inductive in the passband of the reception side surface acoustic wave filter 6 and the phase is made capacitive in the passband of the transmission side surface acoustic wave filter 5. Thus, impedance matching can be realized. As shown in FIG. 11, in the construction in which the resonator that is closest to the common terminal 4 on the antenna side is a series-arm resonator, the passband of the transmission side surface acoustic wave filter 5 is made capacitive, the capacitance and the movement on the Smith chart become larger and, thus, the reflection increases. Accordingly, the loss at the DPX coupling increases.

Figure 10:
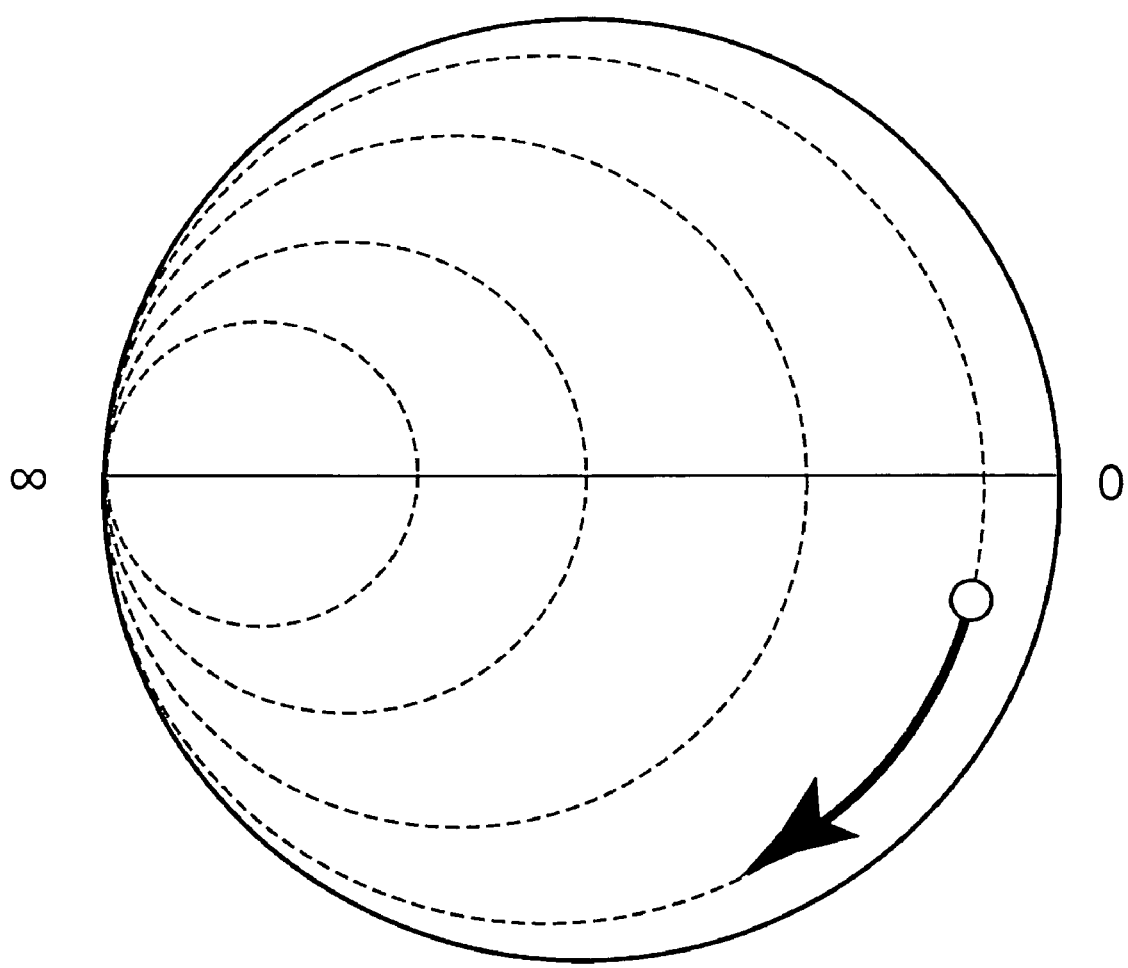
FIG. 10 shows the change of admittance on an admittance Smith chart when the phase is capacitive in the case where the resonator that is closest to the first common terminal on the antenna side is a parallel-arm resonator.

On the contrary, in the present preferred embodiment, a resonator that is closest to the common terminal 4 on the antenna side is the parallel-arm resonator T1. When the passband of the transmission side surface acoustic wave filter is made capacitive by addition of the parallel-arm resonator T1, the movement as shown in FIG. 10 is performed. The reflection decreases and, as a result, deterioration of characteristics at the DPX coupling can be reduced.

While the present invention has been described with respect to preferred embodiments, it will be apparent to those skilled in the art that the disclosed invention may be modified in numerous ways and may assume many embodiments other those specifically set out and described above. Accordingly, it is intended by the appended claims to cover all modifications of the present invention which fall within the true spirit and scope of the invention.

What is claimed is:

1. A surface acoustic wave branching filter comprising:
   a first surface acoustic wave filter having a ladder-type circuit structure including a plurality of parallel-arm resonators and a plurality of series-arm resonators, the first surface acoustic wave filter having a relatively low passband;
   a second surface acoustic wave filter having a relatively high passband that is higher than said relatively low passband;

a first common terminal to which one end of each of the first and second surface acoustic wave filters is connected, the first common terminal being connected to an antenna; and a phase adjustment element located between the second surface acoustic wave filter and the first common terminal; wherein one of the plurality of series-arm resonators and parallel-arm resonators that is closest to the first common terminal is a parallel-arm resonator and the capacitance of the parallel-arm resonator that is closest to the first common terminal is less than about ½ of the capacitance of another one of the plurality of parallel-arm resonators; and the amount of phase delay of the phase adjustment element is less than about 90 degrees from a central frequency of the first surface acoustic wave filter and, when seen from the side of the first common terminal, at least about 50% of the passband of the second surface acoustic wave filter is inductive.

2. The surface acoustic wave branching filter as claimed in claim 1, wherein the capacitance of the parallel-arm resonator that is closest to the first common terminal is in the range of about ¹⁄₄₀ to about ⅕ of the capacitance of said another one of the plurality of parallel-arm resonators.

3. The surface acoustic wave branching filter as claimed in claim 1, further comprising a second common terminal to which one end of the parallel-arm resonator that is closest to the first common terminal and one end of the another one of the plurality of parallel-arm resonators are connected, and an inductance element is arranged between the second common terminal and ground potential.

4. The surface acoustic wave branching filter as claimed in claim 3, further comprising a package material housing the first and second surface acoustic wave filters, wherein the second common terminal is included in the package material.

5. The surface acoustic wave branching filter as claimed in claim 1, wherein a resonance frequency of the parallel-arm resonator that is closest to the first common terminal is substantially the same as the resonance frequency of said another one of the plurality of parallel-arm resonators.

6. The surface acoustic wave branching filter as claimed in claim 1, further comprising a phase adjustment element located between the second surface acoustic wave filter and the first common terminal.

7. The surface acoustic wave branching filter as claimed in claim 1, wherein the phase adjustment element includes a stripline.

8. The surface acoustic wave branching filter as claimed in claim 1, wherein the phase adjustment element includes a capacitance element and an inductance element.

9. The surface acoustic wave branching filter as claimed in claim 1, wherein the plurality of parallel-arm resonators is located between two of the plurality of series-arm resonators.

10. A surface acoustic wave branching filter comprising:

a first surface acoustic wave filter having a ladder-type circuit structure including a plurality of parallel-arm resonators and a plurality of series-arm resonators, the first surface acoustic wave filter having a relatively low passband;

a second surface acoustic wave filter having a relatively high passband that is higher than said relatively low passband; and a first common terminal to which one end of each of the first and second surface acoustic wave filters is connected, the first common terminal being connected to an antenna; wherein one of the plurality of series-arm resonators and parallel-arm resonators that is closest to the first common terminal is a parallel-arm resonator and the capacitance of the parallel-arm resonator that is closest to the first common terminal is less than about ½ of the capacitance of another one of the plurality of parallel-arm resonators; and when seen from the side of the first common terminal, at least about 50% of the passband of the second surface acoustic wave filter is inductive.

11. The surface acoustic wave branching filter as claimed in claim 10, wherein the capacitance of the parallel-arm resonator that is closest to the first common terminal is in the range of about ¹⁄₄₀ to about ⅕ of the capacitance of said another one of the plurality of parallel-arm resonators.

12. The surface acoustic wave branching filter as claimed in claim 10, further comprising a second common terminal to which one end of the parallel-arm resonator that is closest to the first common terminal and one end of the another one of the plurality of parallel-arm resonators are connected, and an inductance element is arranged between the second common terminal and ground potential.

13. The surface acoustic wave branching filter as claimed in claim 12, further comprising a package material housing the first and second surface acoustic wave filters, wherein the second common terminal is included in the package material.

14. The surface acoustic wave branching filter as claimed in claim 10, wherein a resonance frequency of the parallel-arm resonator that is closest to the first common terminal is substantially the same as the resonance frequency of said another one of the plurality of parallel-arm resonators.

15. The surface acoustic wave branching filter as claimed in claim 10, another of the plurality of parallel-arm resonators is located between two of the plurality of series-arm resonators.

* * * * *